United States Patent [19]
Ruffell et al.

[11] Patent Number: 5,053,627
[45] Date of Patent: Oct. 1, 1991

[54] APPARATUS FOR ION IMPLANTATION

[75] Inventors: John P. Ruffell, Beverly Farms, Mass.; Michael A. Guerra, Exeter, N.H.

[73] Assignee: Ibis Technology Corporation, Danvers, Mass.

[21] Appl. No.: 487,597

[22] Filed: Mar. 1, 1990

[51] Int. Cl.[5] ............................................ H01J 37/317
[52] U.S. Cl. ................................. 250/492.2; 250/398
[58] Field of Search ............ 250/492.21, 492.2, 492.3, 250/398

[56] References Cited

U.S. PATENT DOCUMENTS

| | | | |
|---|---|---|---|
| 2,777,958 | 1/1957 | le Poole | 250/49.5 |
| 3,855,009 | 12/1974 | Lloyd et al. | 148/1.5 |
| 4,276,477 | 6/1981 | Enge | 250/398 |
| 4,346,301 | 8/1982 | Robinson et al. | 250/492.21 |
| 4,564,763 | 1/1986 | Bruel et al. | 250/396 |
| 4,749,660 | 6/1988 | Short et al. | 437/24 |
| 4,786,608 | 11/1988 | Griffith | 437/24 |

FOREIGN PATENT DOCUMENTS

| | | | |
|---|---|---|---|
| 60-80800 | 5/1985 | Japan | 250/492.21 |
| 172103 | 9/1970 | Netherlands | |
| 8801731 | 3/1988 | PCT Int'l Appl. | |

OTHER PUBLICATIONS

"The ASM-220 Medium Current Implanter", Berrian et al., Nuclear Instruments and Methods in Physics Research, B37/38, pp. 500–503, (1989).

"Performance Characteristics of the Extrion 160-10 Ion Implantation System", Liebert et al., Nuclear Instruments and Methods in Physics Research, B6, pp. 16–26 (1985).

"Fine Ion Beam Optical System", Keller et al., IBM Technical Disclosure Bulletin, vol. 19, No. 4, Sep. 1976).

"Effect of Extended Fringing Fields on Ion-Focusing Properties of Deflecting Magnets", Enge, The Review of Scientific Instruments, vol. 35, 278–287 (Mar. 1964).

Primary Examiner—Jack I. Berman
Attorney, Agent, or Firm—Thomas J. Engellenner

[57] ABSTRACT

An apparatus for particle implantation is disclosed employing a plurality of particle generators to effectively process wafers of other target substrates carried on a rotating end station. The invention is particularly useful in SIMOX processes where implanted oxygen ions form a buried oxide layer in silicon wafers. In one embodiment, two or more stationary particle generators are disposed at different sectors of a circular track along which the wafers travel to expose the wafers in sequence as they pass. The ion sources can also be offset regularly from each other to increase the radial exposure area. In an other embodiment, the apparatus can further include at least one particle generator which scans the rotating end station in a radial direction as it rotates to insure that uniform ion doses are achieved.

6 Claims, 6 Drawing Sheets

APPARATUS FOR ION IMPLANTATION

BACKGROUND OF THE INVENTION

The technical field of this invention is the implantation of ions into targets, such as semiconductor wafers, and, in particular, systems and techniques for achieving highly uniform implantation doses for the formation of buried layer devices and the like.

Ion implantation techniques are particularly useful in forming a class of buried layer devices known as silicon-on-insulator (SOI) devices. In these devices, a buried insulation layer is formed beneath a thin surface silicon film. These devices have a number of potential advantages over conventional silicon devices (e.g., higher speed performance, higher temperature performance and increased radiation hardness).

In one known technique, known by the acronym SIMOX, a very thin (1,000 Angstroms–3,000 Angstroms) layer of a monocrystalline silicon substrate is separated from the bulk of the substrate by implanting oxygen ions (e.g., with an implant dose of about $1.0 \times 10^{18}$ to $3.0 \times 10^{18}$ oxygen ions per square centimeter) into the substrate to form a buried dielectric layer (having a typical thickness ranging from about 1,000 Angstroms to 5,000 Angstroms). This technique of "separation by implanted oxygen" (SIMOX), provides a heterostructure in which a buried silicon dioxide layer serves as a highly effective insulator for surface layer electronic devices.

Because of the high dosages required to produce buried silicon dioxide layers, conventional SIMOX techniques are often very time-consuming. The implantation dose that can be delivered to a substrate over any given period of time is largely a function of the current density and power of the implantation ion beam. In practice, there is a limit on the power which can be achieved by conventional ion implanters; typically, when the implantation current rises above about 75 milliamps, the beam becomes very unwieldy and either thermal damage or erratic implantation profiles ensue. For these reasons, lower current densities are often employed in SIMOX fabrication techniques and, as a result, the implantation process can take as long as 24 hours.

There exist a need for better techniques for ion implantation, particularly, techniques which would reduce the time necessary to implant buried layers in target substrates and/or improve the uniformity of the implants.

SUMMARY OF THE INVENTION

An apparatus for particle implantation is disclosed employing a plurality of particle generators to effectively process wafers or other target substrates carried on a rotating end station. The invention is particularly useful in SIMOX processes where implanted oxygen ions form a buried oxide layer in silicon wafers. In one embodiment, two or more stationary particle generators are disposed at different sectors of a circular track along which the wafers travel to expose the wafers in sequence as they pass. The ion sources can also be offset radially from each other to increase the radial exposure area. In an other embodiment, the apparatus can further include at least one particle generator which scans the rotating end station in a radial direction as it rotates to insure that uniform ion doses are achieved.

The multiple beam arrangements of the present invention are advantageous because they overcome the problems inherent in the use of a single, high power beam. Because each individual generator can be operated at a current below 100 milliamps, the problems associated with higher current densities (e.g., non-uniformities and static charge build-up) are substantially reduced. Cycling with a plurality of particle beams permits the wafers to be implanted with a higher dose of ions in a given period of time than the use of a single particle source would permit and also provides for charge dissipation between implant doses. Similarly, the potential for thermal damage to the wafers is also greatly reduced insofar as the thermal effects can be dissipated between implant doses.

The multiple beam approach of the present invention also significantly reduces the requirements on the ion sources and their power supplies, as well as on the acceleration assemblies and their power supplies. Moreover, by reducing the power requirements on the high voltage supplies, the possibilities of electrical discharges and resulting damage and/or transient events are substantially lessened.

In one illustrated embodiment of the invention, the wafers are disposed upon a rotating support structure, such that they travel in a circular track. Each particle generator provides an elongated beam that extends radially so as to cover (and preferably extend beyond) the circular path along which the wafers travel.

In another aspect of the invention, the apparatus can employ not only fixed beams of particles to expose the wafers but also one or more scanning particle beams which operate to raster back and forth across the wafer as it passes. In one illustrated embodiment, the scanning particle beams traverse the circular path of the wafer in a radial direction and expose each wafer from one to about 10 times as it passes. The use of such scanning beams can be effective to "paint in" any areas of non-uniform areas of ion implantation arising from the use of the fixed particle beams.

For example, in one embodiment, three oblong, stationary beams (elongated in the radial direction) can be used to uniformly irradiate wafers at different points along a circular track. In conjunction with these fixed particle beams, a single scanning beam having a smaller exposure zone can be used to scan the wafers in a radial direction (e.g., about 3 to about 5 scans per pass) at another point along the circular path.

In another alternative embodiment, a plurality of scanning particle beams can be arranged, such that each particle generator scans the circular track as the wafers travel along it. The repeated scanning operations of the particle beams again insure that uniform implant doses will be achieved.

It is preferable to maintain a parallel beam during such scanning operations to avoid channeling within the wafer and also preferable to slow down the radial scan as the beam reaches the outer edge of the circular track so as to insure a uniform implant dosage.

In another aspect of the invention, a feedback control system is employed for monitoring the ion doses received by the wafers and for modifying one or more of the particle beam generators in response to the measured conditions. For example, a Faraday cup sensor can be disposed upon the wafer support structure and used to measure ion doses at various points along the circular track, as well as at varying radial positions. When a non-uniformity is detected, a scanning particle beam can either be activated or modified in its operation to provide either more or less coverage for the affected area during subsequent passes along the circular track.

The invention will next be described in connection with certain illustrated embodiments; however, it should be clear that various changes, additions and subtractions can be made by those skilled in the art without departing from the spirit or scope of the invention. For example, the term "particle" is used herein to encompass not only negatively or positively charged particles but also particles that have been neutralized following acceleration. Moreover, although the apparatus is described in connection with a rotating end station, it should be clear that the relative movement of the end station and particle generators can be, likewise, achieved by the rotation of the particle generator assemblies, instead.

BRIEF DESCRIPTION OF THE DRAWINGS

FIG. 7A is an enlarged, superimposed illustration of the sensor elements of FIG. 7.

DETAILED DESCRIPTION OF THE INVENTION

Figure 1:
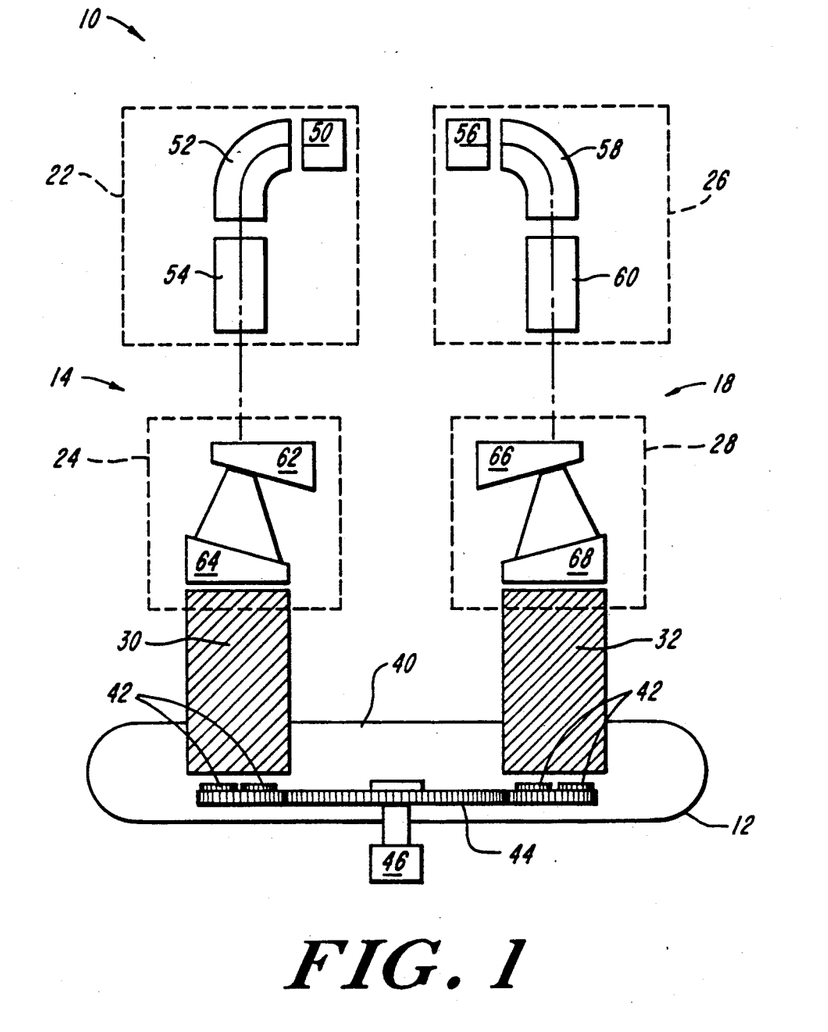
FIG. 1 is an schematic block diagram of an ion implantation apparatus according to the invention.

In FIG. 1, an apparatus 10 is shown for particle implantation, including a chamber 12, at least two particle beam generators 14 and 16 and an end station 40 carrying wafers or other implantation targets 42. Particle generator 14 can include, for example, a beam delivery assembly 22 and a beam forming assembly 24. Particle generator 16 similarly includes beam delivery assembly 26 and beam forming assembly 28. The beam forming elements 24 and 28 can simply shape the particles into a desired beam shape or, as described in more detail below, one or more of the beam forming assemblies can be employed to scan a particle beam across an exposure zone.

End station 40 includes a support structure 44, adapted to receive wafers or other targets, and a drive mechanism 46 which can be disposed, in whole or part, outside of the chamber 12. In the illustrated embodiment, wafers 42 are disposed in a circular array for rotation by drive mechanism 46, such that the wafers are sequentially exposed to charged particle beams 30 and 32 generated by sources 14 and 16, respectively.

The beam delivery assemblies 22 and 26 can be constructed according to various known techniques. As shown in FIG. 1, beam delivery assembly 22 can include an ion source 50, a magnetic analyzer 52 (to select appropriately-charged ions) and an acceleration section 54. Beam delivery assembly 26 can, likewise, include an ion source 56, an analyzer 58 and an accelerator 60. For further details on the construction of particle beam delivery systems, see, for example, Liebert et al., "Performance Characteristics of the Extrion 160-120 Ion Implantation," *Nuclear Instruments and Methods in Physics Research.* pp. 16–26 (1985) and Berrian et al., "The ASM-220 Medium Current Implanter," *Nuclear Inst. and Methods in Physics Research.* pp. 500–503 (1989), herein incorporated by reference. When employed in a SIMOX operation, each beam delivery assembly can generate a beam of oxygen ions capable of penetrating a silicon wafer and forming a buried dielectric isolation layer of $SiO_2$ beneath the wafer surface.

The beam forming assemblies 24 and 28 can be simple electrostatic or magnetic lenses, or they can employ an electric or magnetic field which varies over time to raster the beam back and forth across the target. It is preferable that the output of each beam forming element be a charged particle beam of substantially constant fluence. To avoid non-uniform dosages which may be present at the beam edges, it is also preferable that the exposure zone extend radially beyond the wafers.

Moreover, it is also preferable to provide a double deflection mechanism to achieve beam expansion and/or lateral displacement of the beam without introducing any substantial degree of divergence in the output beam. Such compensation can be obtained, as shown schematically in beam forming assembly 24, by complementary beam shaping elements 62 and 64. Similarly, beam forming assembly 28 can include complementary elements 66 and 68.

Figure 2:
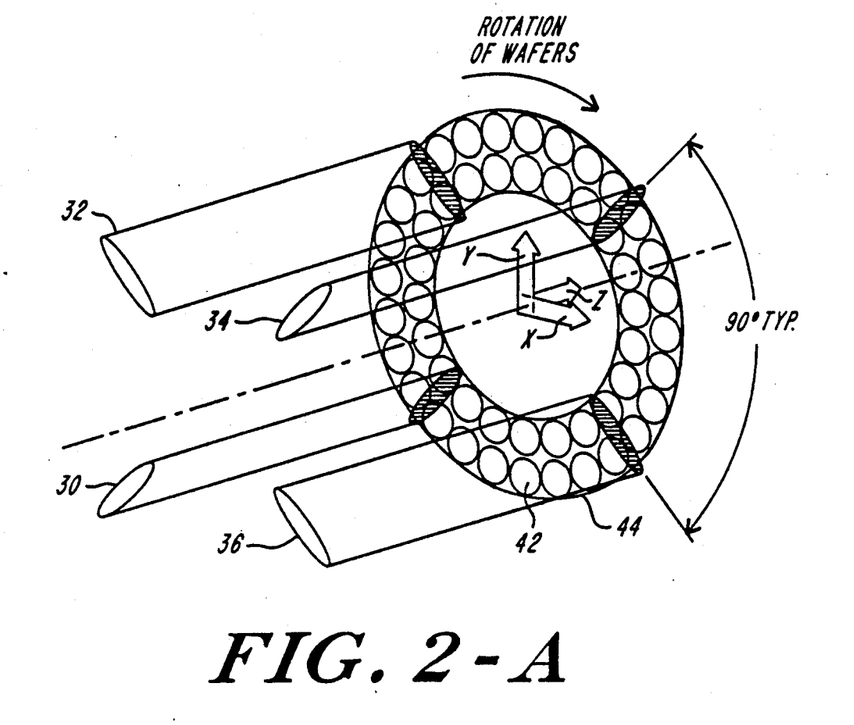
FIG. 2A is a more detailed perspective illustration of a rotating wafer array for use in an apparatus according to FIG. 1 employing a plurality of fixed implantation beams.
FIG. 2B is a top view of the rotating wafer array of FIG. 2A.

In FIGS. 2A and 2B, a more detailed perspective illustration of an apparatus, according to the invention, including an array of wafers 42 disposed on a support structure 44 and a plurality of fixed implantation beams 30, 32, 34 and 36. Each beam is expanded radially to provide an exposure zone 38 that covers (and extends beyond) the circular path along which the wafers travel.

Figure 3:
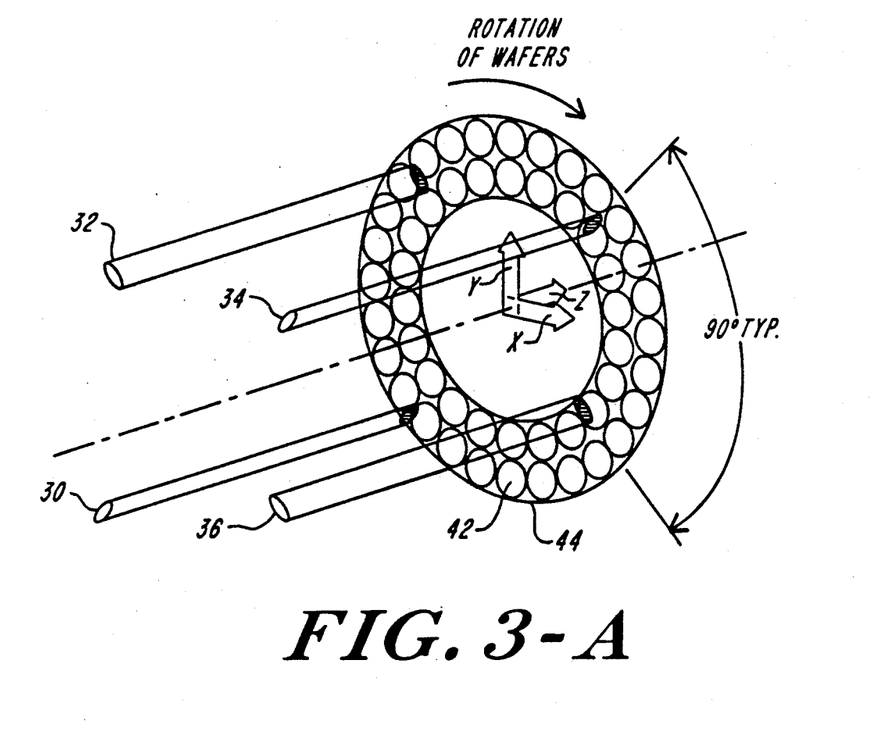
FIG. 3A is a more detailed perspective illustration of a rotating wafer array and an alternative source beam arrangement for use in an apparatus according to FIG. 1 employing a plurality of fixed overlapping implantation beams.
FIG. 3B is a top view of the rotating wafer array of FIG. 3A.

In FIGS. 3A and 3B, an alternative apparatus is shown again, including an array of wafers 42 disposed on a support structure 44 and a plurality of fixed implantation beams 30, 32, 34 and 36. In this embodiment, the beams are collated for overlapping exposure, such that the cumulative effect is to provide an exposure zone 38 that covers (and extends beyond) the circular path along which the wafers travel.

Figure 4:
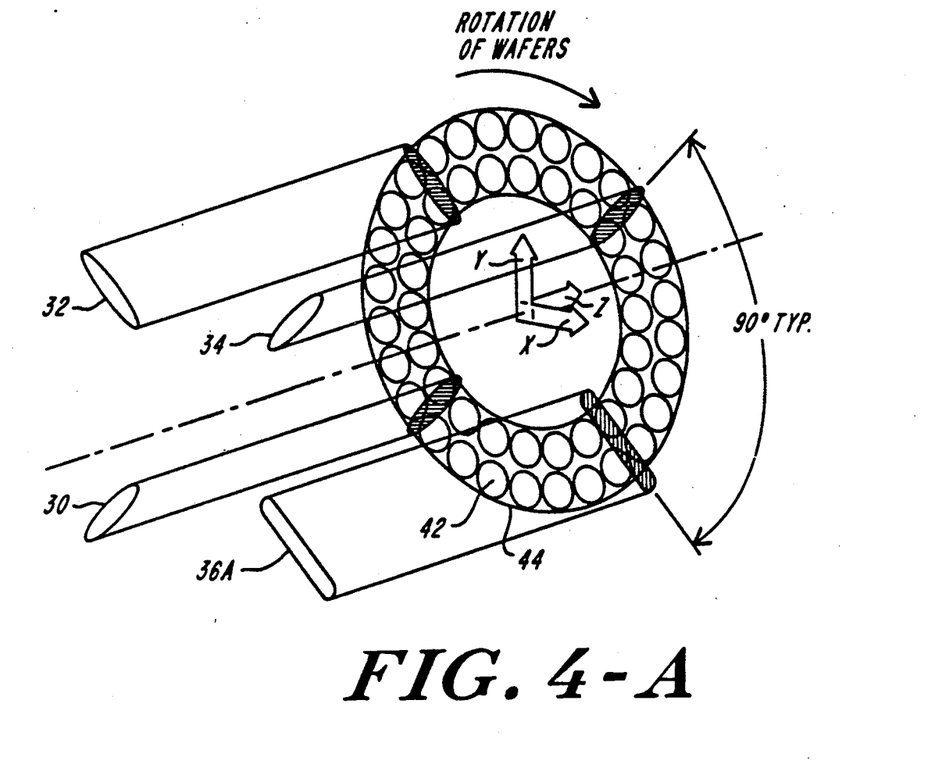
FIG. 4A is a more detailed perspective illustration of a rotating wafer array and another alternative source beam arrangement for use in an apparatus according to FIG. 1 employing a plurality of fixed implantation beams and one radially scanning beam.
FIG. 4B is a top view of the rotating wafer array of FIG. 4A.

In FIGS. 4A and 4B, another alternative apparatus is shown, including an array of wafers 42 disposed on a support structure 44, a plurality of fixed implantation beams 30, 32, 34 and a single scanned beam 36A. In this embodiment, beams 30, 32, and 34 again provide a cumulative exposure zone 38 that covers (and extended beyond) the circular path along which the wafers travel. Beam 36 repeatedly scans the track in the radial direction in order to "paint in" dose non-uniformities. The current and energy of the beams can be individually controlled, and any deviations from the desired current distribution can be finely controlled by the action of scanning beam 36A.

Figure 5:
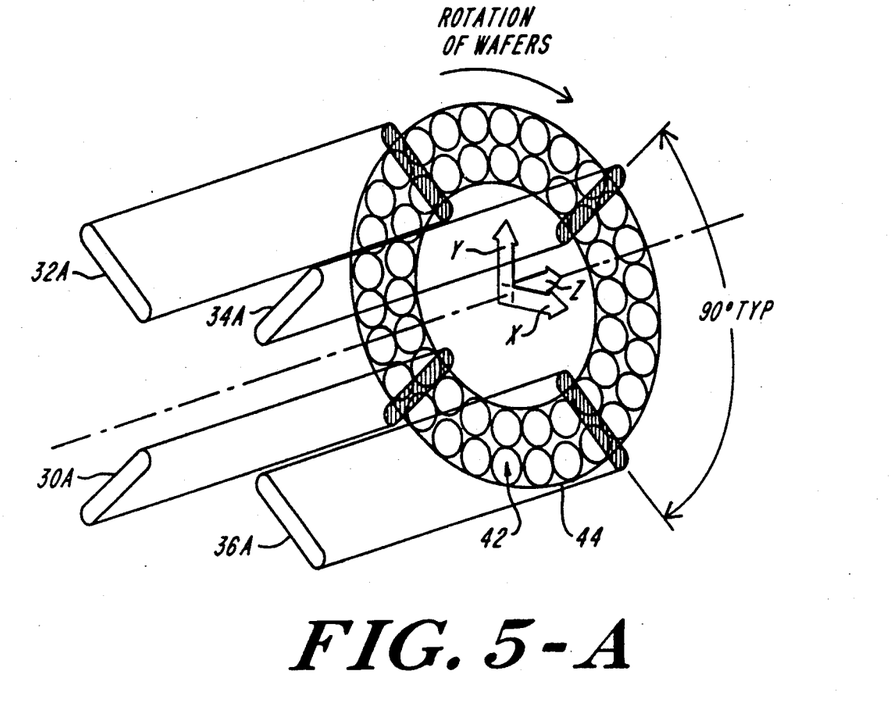
FIG. 5A is a more detailed perspective illustration of a rotating wafer array and yet another alternative source beam arrangement for use in an apparatus according to FIG. 1 employing a plurality of radially scanning implantation beams.
FIG. 5B is a top view of the rotating wafer array of FIG. 5A.

In FIGS. 5A and 5B another alternative apparatus is shown including an array of wafers 42 disposed on a support structure 44, and a plurality of scanning implantation beams 30A, 32A, 34A and 36A. In this embodiment, the radial scan zone of each of the beams provides a cumulative exposure zone 38 that covers (and extends beyond) the circular path along which the wafers travel. Each of the beams repeatedly scans the track in the radial direction. Again, the current and energy of the beams can be individually controlled and any deviations from the desired current distribution can be finely controlled by adjusting the scanning speed or energy of one or more of the individual beams 30A, 32A, 34A, or 36A.

Figure 6:
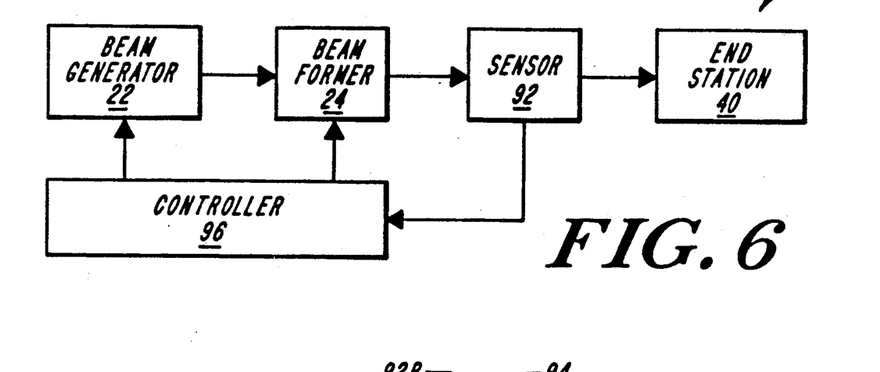
FIG. 6 is a schematic diagram of a feedback control system for use in the apparatus of FIG. 1.

In FIG. 6 a feedback control system 90 for use in the apparatus of FIG. 1 is shown schematically, including particle delivery assembly 22, beam forming assembly 24, end station 40, sensor 92 and controller 96. In practice, the sensor 92 can be used to measure the performance of more than one particle beam, as discussed in more detail below. Controller 96 can be a microprocessor-based control means and operates to adjust the operating parameters of the particle beam generators (e.g., power, current density, scanning rates) to ensure uniform implant doses.

Figure 7:
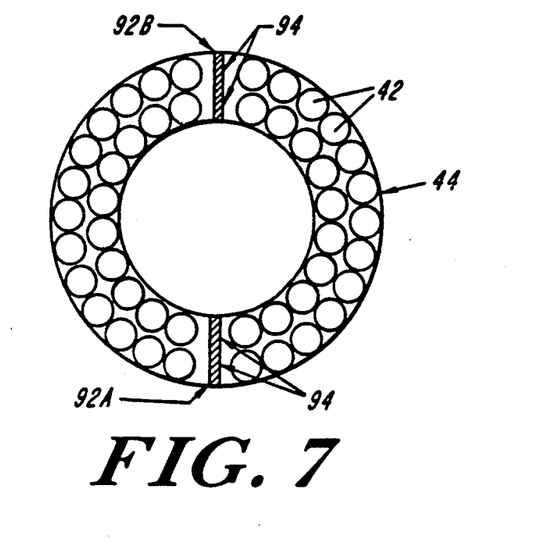
FIG. 7 is a schematic top view of a rotating wafer array incorporating sensor elements for use in the feedback control system of FIG. 6.

In FIG. 7 a sensor assembly for use in the feedback control system of FIG. 6 is shown including two sensor arrays 92A and 92B which are disposed on diametrically opposed sides of the rotating array 44. Each of the arrays includes a plurality of sensor elements 94 which can be, for example, Faraday cup devices to measure the ion current impinging on various radial segments of the array 44. (For increased resolution, the sensor elements of one array can be staggered or offset in the radial direction from the position of the other sensor array, as shown schematically in FIG. 7A.) As noted above, signals from the sensor arrays can be used to modify the current or scanning operations of one or more of the beam delivery assemblies or beam forming assemblies in order to compensate for any non-uniformities detected.

In use the system of FIG. 1 can be employed to form a buried oxide layer within silicon wafers by implanting about $1.0 \times 10^{18}$ to about $3.0 \times 10^{18}$ oxygen ions per square centimeter. For example, the wafers can be first preheated to about 500° C. (e.g., by a quartz heater) in the evacuated chamber and then implanted using two or more separate particle beam generators which expose different sectors of an array of wafers rotating at about 10 to about 100 rpms.

Using four beam generators, each operating at about 5 to about 25 kilowatts and generating a beam current of about 50 to about 100 milliamps per beam, the desired implant dose can be achieved in about 4 to about 8 hours. Following implantation, defects in the surface silicon layer can be cured by annealing in an oven at about 1320° C. for about six hours to obtain a device having a surface silicon layer about 2000 Angstroms in thickness and a buried silicon dioxide layer about 2000 to about 4000 Angstroms thick below the silicon surface layer.

We claim:

1. An apparatus for implanting a cumulative does of oxygen ions into a target, the apparatus comprising:
    a support structure defining a plane on which to hold at least one target;
    a plurality of oxygen ion beam generators for exposure of said target to a plurality of parallel oxygen ion beams; and
    rotational means for movement of the support structure relative to said beams, such that the target travels along a circular track in a said plane with respect to the beams and is exposed to oxygen ions from each of said beams in sequence.

2. The apparatus of claim 1 wherein at least one of said beam generators is offset from another beam generator to provide the target with a different exposure.

3. The apparatus of claim 1 wherein at least one of said particle beam generators further includes a scanning means for scanning the target during exposure.

4. The apparatus of claim 3 wherein the scanning means further includes means for correction of angular variations in the particle beam during exposure.

5. The apparatus of claim 3 wherein the apparatus further includes control means for varying the speed of scanning.

6. The apparatus of claim 5 wherein the apparatus further includes monitoring means for monitoring the progress of implantation and for transmitting signals to said control means.

* * * * *

UNITED STATES PATENT AND TRADEMARK OFFICE
CERTIFICATE OF CORRECTION

PATENT NO. : 5,053,627

DATED : October 1, 1991

INVENTOR(S) : John P. Ruffell et al.

It is certified that error appears in the above-identified patent and that said Letters Patent is hereby corrected as shown below:

Column 6, line 22, replace "does" with --dose--.

Column 6, line 31, replace "in a said plane" with --in said plane--.

Signed and Sealed this

First Day of June, 1993

MICHAEL K. KIRK

*Attest:*

*Attesting Officer*  *Acting Commissioner of Patents and Trademarks*